United States Patent
Ems et al.

(10) Patent No.: US 8,390,300 B2
(45) Date of Patent: Mar. 5, 2013

(54) TIME DOMAIN REFLECTOMETRY IN A COHERENT INTERLEAVED SAMPLING TIMEBASE

(75) Inventors: Stephen Ems, Sloatsburg, NY (US); Simon Kreymerman, Suffern, NY (US); Peter J Pupalaikis, Ramsey, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 259 days.

(21) Appl. No.: 12/888,550

(22) Filed: Sep. 23, 2010

(65) Prior Publication Data

US 2011/0187381 A1    Aug. 4, 2011

Related U.S. Application Data

(60) Provisional application No. 61/299,395, filed on Jan. 29, 2010.

(51) Int. Cl.
  *G01R 31/11* (2006.01)
(52) U.S. Cl. .................................................. 324/533
(58) Field of Classification Search .................. 324/533
  See application file for complete search history.

(56) References Cited

U.S. PATENT DOCUMENTS

| | | | | |
|---|---|---|---|---|
| 4,755,742 A * | 7/1988 | Agoston et al. | ............... | 324/642 |
| 5,521,512 A * | 5/1996 | Hulina | ............. | 324/533 |
| 6,124,717 A * | 9/2000 | Guenther et al. | ............... | 324/642 |
| 7,446,699 B2 * | 11/2008 | McEwan | ....................... | 342/199 |
| 8,222,906 B2 * | 7/2012 | Wyar et al. | ...................... | 324/533 |
| 2004/0232919 A1 * | 11/2004 | Lacey | .............. | 324/533 |
| 2005/0057869 A1 * | 3/2005 | Hale et al. | ....................... | 361/64 |
| 2005/0200347 A1 * | 9/2005 | Agoston et al. | ............... | 324/76.15 |
| 2006/0002239 A1 * | 1/2006 | Gage et al. | ..................... | 368/118 |
| 2006/0177018 A1 * | 8/2006 | Kobayashi et al. | ......... | 379/88.07 |
| 2007/0177704 A1 * | 8/2007 | McEwan | ....................... | 375/376 |

* cited by examiner

*Primary Examiner* — Jermele M Hollington
*Assistant Examiner* — Demetrius Pretlow
(74) *Attorney, Agent, or Firm* — Gordon Kessler

(57) ABSTRACT

A system and method for performing a time domain reflectometry measurement. The system includes a coherent interleaved sampling timebase, a sampling strobe generator for generating one or more sampling strobes in accordance with the coherent interleaved sampling timebase, a time domain reflectometry sampling strobe generator for generating one or more time domain reflectometry strobes in accordance with one or more of the generated sampling strobes; and a sampling module for sampling a time domain reflectometry signal in accordance with one or more of the one or more generated sampling strobes and one or more of the one or more generated time domain reflectometry strobes. The system further includes an analog to digital converter for analog to digital converting the samples of the time domain reflectometry signal and a memory for storing the converted samples of the time domain reflectometry signal.

12 Claims, 5 Drawing Sheets

TIME DOMAIN REFLECTOMETRY IN A COHERENT INTERLEAVED SAMPLING TIMEBASE

CROSS REFERENCE TO RELATED APPLICATIONS

This application claims the benefit under 35 USC 119 of U.S. Provisional Patent Application Ser. No. 61/299,395 filed Jan. 29, 2010, titled "Time Domain Reflectometry in a Coherent Interleaved Sampling Timebase", currently pending, the contents thereof being incorporated herein by reference.

FIELD OF THE INVENTION

This invention is related generally to a method and apparatus for acquiring samples for a time domain reflectometry (TDR) system, and more particularly to the use of a coherent interleaved sampling (CIS) timebase to acquire these samples.

BACKGROUND OF THE INVENTION

A TDR system measures the reflections of an incident waveform from impedance discontinuities in the system under test. Typical TDR systems could be sonar to detect underwater objects, ultrasound to detect objects inside the body and as described in this invention, voltage steps to detect discontinuities in electrical systems. A TDR pulse in a TDR system is typically a fast rising voltage step that repeats at a regular rate so an internal timebase can sample the reflections from the discontinuities.

TDR systems typically use a sequential sampling timebase to sample the TDR voltage step. A sequential sampling timebase samples the TDR waveform by delaying a sampling strobe from the trigger generated by the TDR voltage step. These delay circuits are inherently nonlinear and subject to large time jitter. The record length of a sequential sampling timebase is typically less than 10,000 samples independent of the sampling rate. As you increase the sampling rate, the record length stays the same so the time period of the record decreases.

Therefore it would be beneficial to provide an improved method and apparatus that overcomes the drawbacks of the prior art.

Still other objects and advantages of the invention will in part be obvious and will in part be apparent from the specification and the drawings.

SUMMARY OF THE INVENTION

Therefore, in accordance with the invention, a test and measurement apparatus is provided that relies upon a CIS timebase for sampling in a TDR system. A CIS timebase record length increases as one increases the sampling rate maintaining the time period of the waveform. The sample spacing of a CIS timebase is very linear, since it depends on a sampling clock that is locked to a stable reference clock with a phase lock loop (PLL). PLL jitter, and therefore sampling jitter, is easy to minimize with the designs and components currently available. Generating a TDR voltage step from a stable reference clock ensures the linearity of the sampling with respect to the TDR voltage step. The linear timebase sampling of the TDR voltage step reduces the dependence of the waveform shape on the delay of the TDR voltage step. This allows simple correction of the time position of the TDR voltage step due to temperature and other variations in delay.

The delay position of the TDR voltage step and the time window around the TDR voltage step can be adjusted at will without causing any changes in the recording of the reflections due to discontinuities.

Therefore, in accordance with the invention, a method and apparatus are provided that provide for a more accurate and jitter reducing sampling system for use with a TDR system.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

A CIS timebase produces a sampling clock locked to a fraction of the input reference clock. Commonly assigned Patent Application US 2006/0177018, titled "Coherent Interleaved Sampling" describes such a CIS timebase, the contents of this application being incorporated herein by reference. In accordance with the present invention, a TDR system uses a version of such a CIS timebase. The CIS timebase employed in accordance with this TDR implementation will now be described in greater detail.

Figure 1:
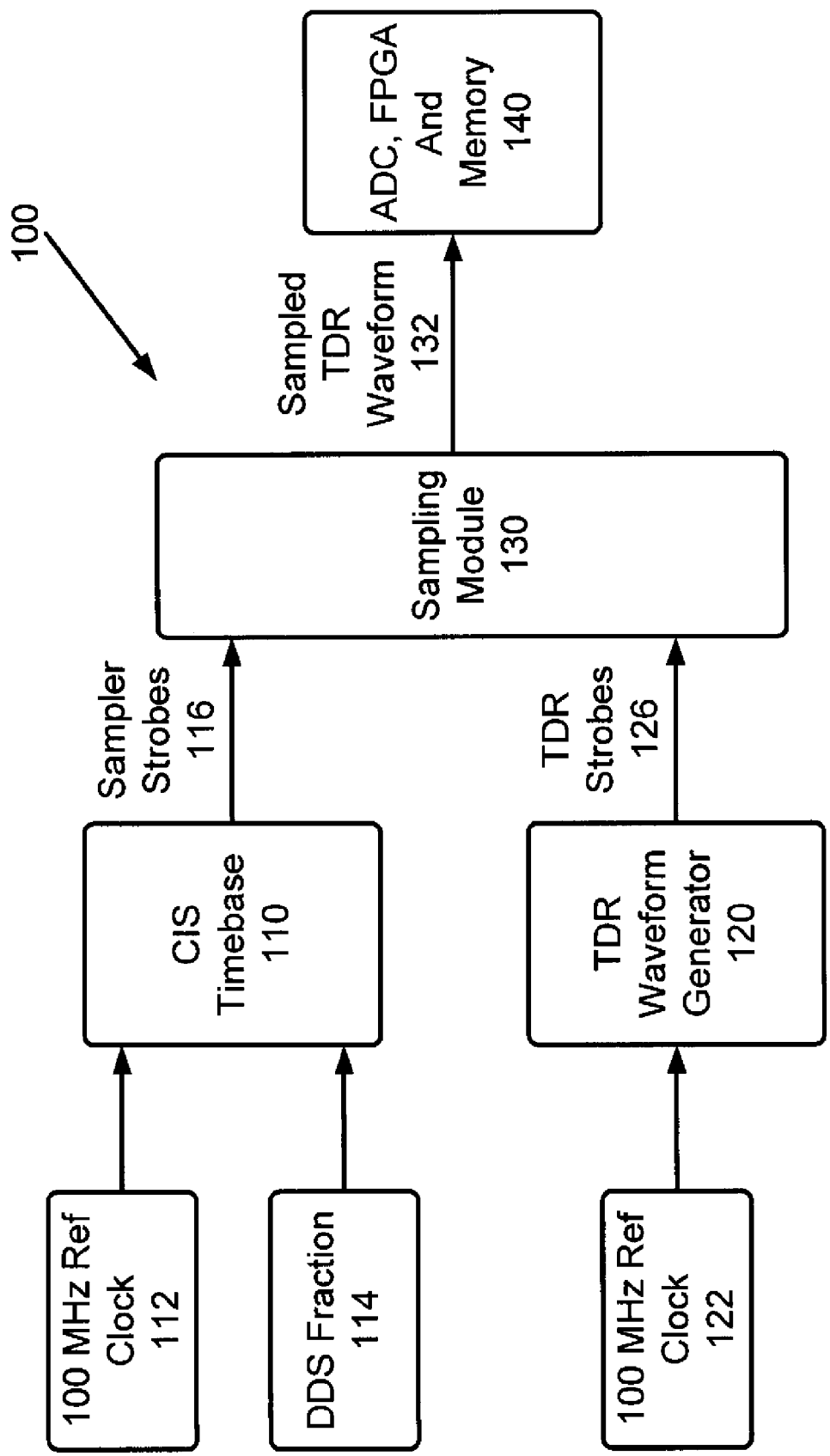
FIG. 1 is a block diagram depicting a TDR sampling system employing a CIS timebase in accordance with an embodiment of the present invention.

FIG. 1 is a block diagram depicting a TDR system using a CIS timebase 100 in accordance with an embodiment of the present invention. The TDR system includes a CIS timebase 110 receiving a 100 MHz reference clock 112 and a DDS fraction 114, and a TDR waveform generator 120 receiving a 100 MHz reference clock 122. The CIS timebase is implemented as described in patent application US 2006/0177018, and produces sampler strobes 116. The TDR waveform generator produces a voltage step waveform 126 whose period is an integer number of reference clock periods. Sampling module 130 for generating sampled TDR waveforms 132, and ADC, FPGA and memory sections 140 are also shown and may be implemented in any number of ways known to those of ordinary skill in the art.

Any reference clock frequency may be used in this TDR implementation, but preferably, the reference clock frequency may be 100 MHz. The TDR waveform period can be any integer number of reference clock periods larger than 2. The high time and low time of the TDR waveform is also preferably an integer number of reference clock periods in accordance with a preferred implementation of the invention. This variable TDR waveform repetition rate allows one to chose the record length based on the TDR area of interest. Physically longer devices under test (DUT) may require a longer TDR waveform and therefore slower update rate. Shorter DUTs on the other hand, can be measured with shorter waveforms and thus shorter record lengths and faster update.

The CIS timebase preferably uses a reference clock and a stable PLL to lock the sampling clock to a fraction of the reference clock as defined by the direct digital synthesizer (DDS) fraction input to the CIS timebase block. Since the TDR waveform is created with an integer number of periods of the reference clock, it too is locked to the sampling clock. A fraction input of the CIS timebase controls the offset frequency of the sampling clock so the TDR waveform can be sampled by the Sampling module with a linear and low jitter sample rate. The ADC captures the sampled waveform and stores it in memory.

The CIS timebase is adapted to acquire waveforms rapidly so that fast summing of successive waveforms into memory may be implemented by the FPGA. This allows computing an average of the acquired waveforms on readout, so that noise on the waveform can be reduced to any amount desired by the user.

Summing of successive waveforms may be performed continuously by the FPGA into memory because the sample rate is slow enough at approximately 10 MS/s per channel that the FPGA can process all received data. This continuous processing may result in nearly zero dead time between acquisitions. The FPGA keeps track of the number of waveforms summed into memory so that upon readout the resultant waveform data comprising the summed waveforms can be divided by the number of summed waveforms to produce an average. The number of waveforms to be summed together is preferably programmable but may preferably be interrupted at any time for intermediate readout.

The fraction input of the CIS timebase is calculated based on the reference clock of 100 MHz and the preferred desired acquisition samples per reference clock period of 10 ns, although other preferred samples per reference clock period may be employed. The algorithm defined in patent application US 2006/0177018 is used to calculate the fraction. Any power of 2 samples per reference clock period is allowed limited only by the memory size. A preferred implementation allows up to 32768 samples per reference clock period or about 305 fs per sample.

Figure 2:
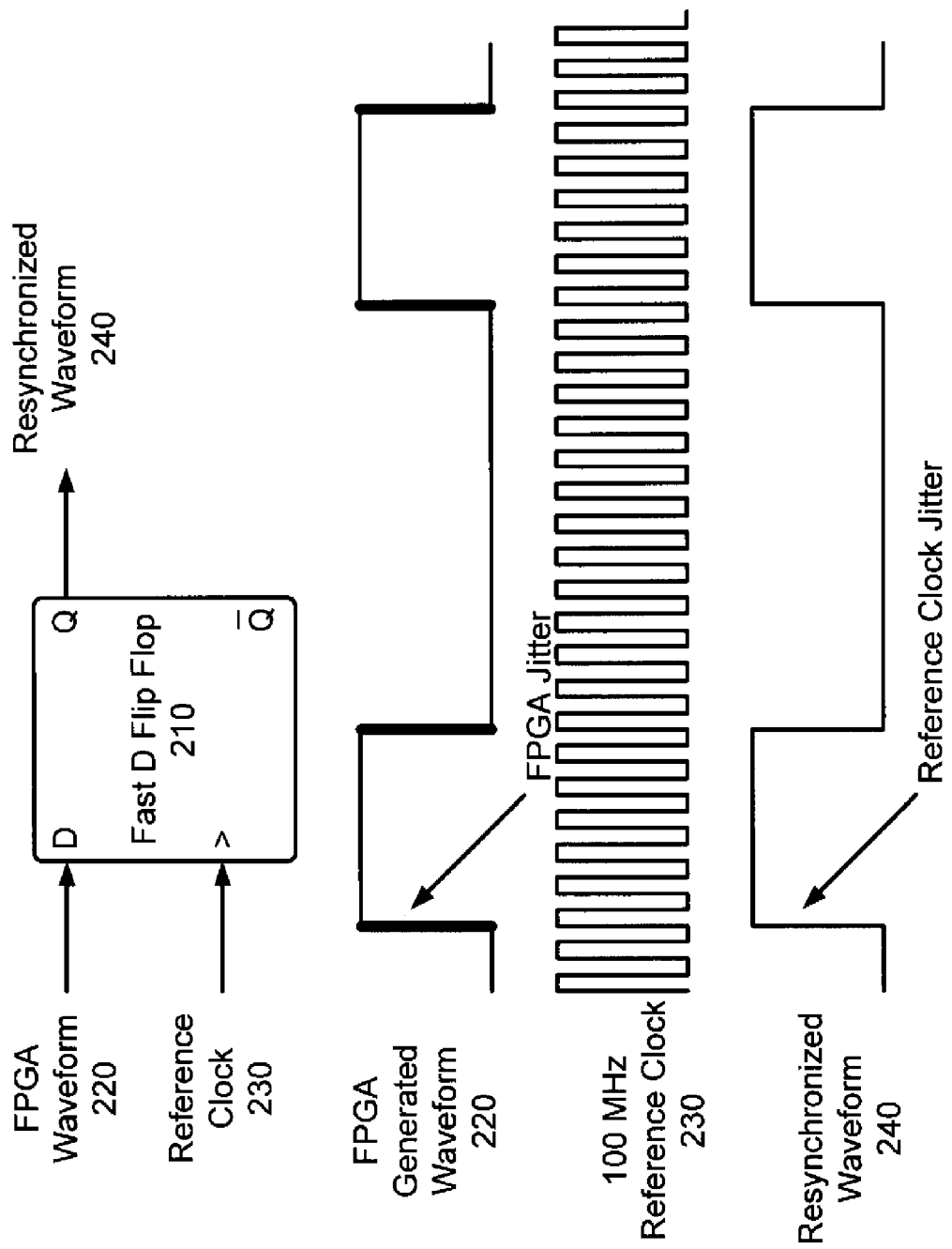
FIG. 2 is a diagram depicting the timing of various signals in accordance with an embodiment of the present invention.

As is shown in FIG. 2, a field programmable gate array (FPGA) uses the reference clock in a divider to provide the TDR waveform with a programmable high and low time in an integer number of reference clock periods. Because FPGAs cannot produce a waveform with low time jitter (see FPGA generated waveform 220), a fast D flip flop 210 resynchronizes the FPGA waveform to the reference clock 230 to produce a low jitter TDR waveform 240. This is shown in FIG. 2 with six reference clock periods of reference clock 230 for the high time of waveforms 220 and 240, and 13 reference clock periods for the low time of the FPGA generated waveform 220 and 240.

Figure 3:
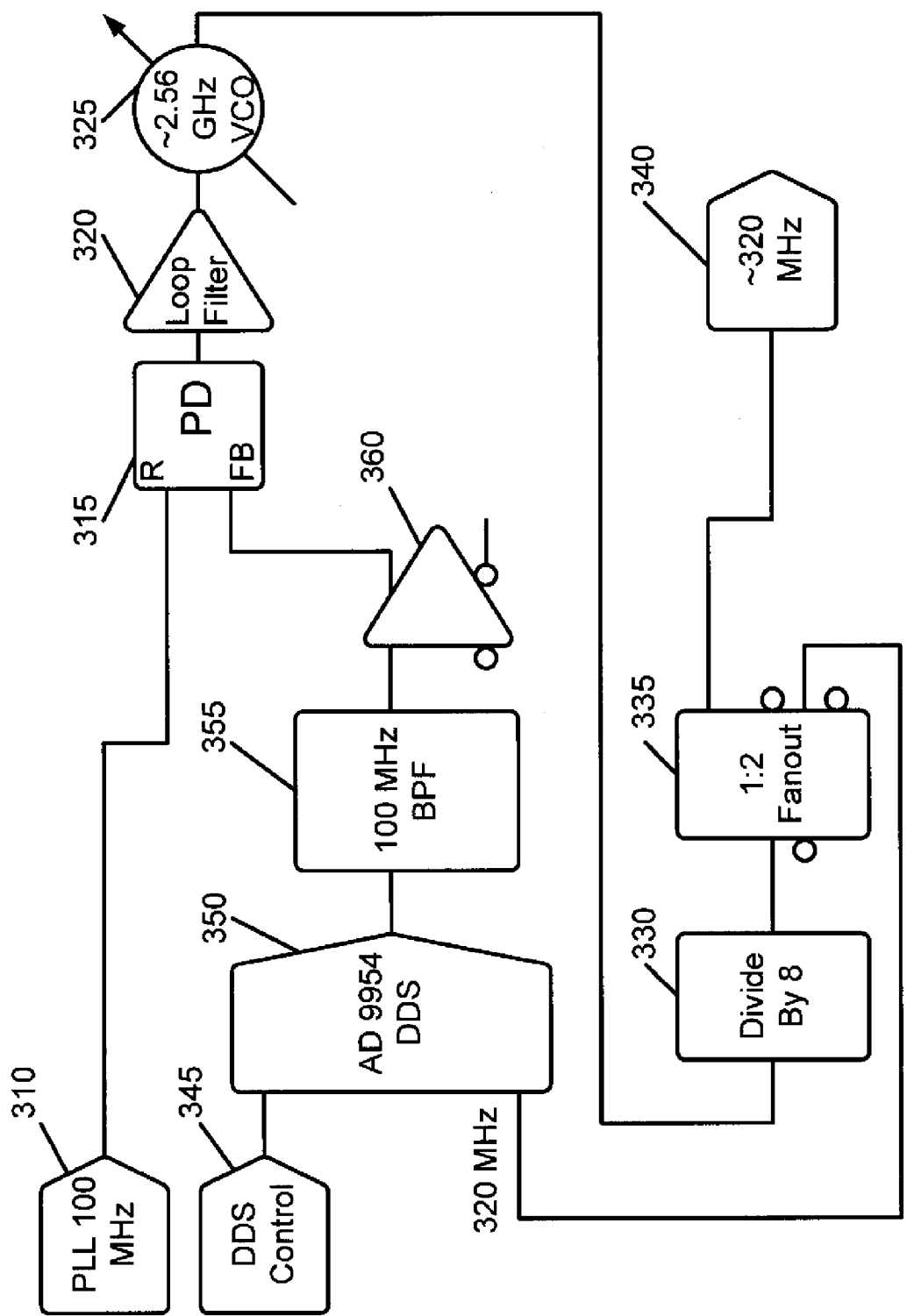
FIG. 3 is a schematic diagram depicting a portion of the CIS timebase portion of FIG. 1 comprising a clock generator.

FIG. 3 depicts a detailed view of the CIS timebase of FIG. 1, and includes a fractional PLL which may be adapted for use with the present invention, and in particular for use meeting particular requirements of the TDNA timebase employed in accordance with the invention. The TDNA timebase operates in accordance with a fixed reference clock 310 at a rate of 100 MHz into a phase detector (PD 315). The output of the phase detector is filtered with a loop filter 320 and then applied to a control input of a voltage controlled oscillator (VCO) 325. In the particular depicted embodiment the ~2.56 GHz VCO output is divided by 8 by a divider 330 to produce the ~320 MHz clock 340. Fanout 335 splits this clock to provide the output 340, and also provides the clock back to a DDS 350. Furthermore, other divisors may be available to provide additional clocks as necessary in accordance with a particular use and environment.

The DDS 350, taking control parameters from DDS control 345, further divides the ~320 MHz by a fraction calculated in accordance with the algorithm set forth in patent application US 2006/0177018 noted above, for example. The DDS output frequency, when properly programmed with the correct fraction by DDS control 345, is preferably 100 MHz and is applied to the FB input of PD 315. The fraction in the DDS forces the PLL to produce an output frequency from the VCO that is slightly offset from the 100 MHz clock. As the 100 MHz clock produces the TDR strobe and the PLL produces the sampling strobe, the sampling strobe sweeps over the TDR strobe waveform. The resultant output from the ADC and memory is a waveform record that is a reproduction of the TDR strobe waveform with as fine a resolution as desired. A particular requirement of this design is a fixed 100 MHz reference clock (or other reference clock as may be applicable). This simplifies the design of the CIS timebase. A simple 100 MHz bandpass filter 355 at the output of the DDS and a fixed loop filter bandwidth 360 completes the TDNA design.

Figure 4:
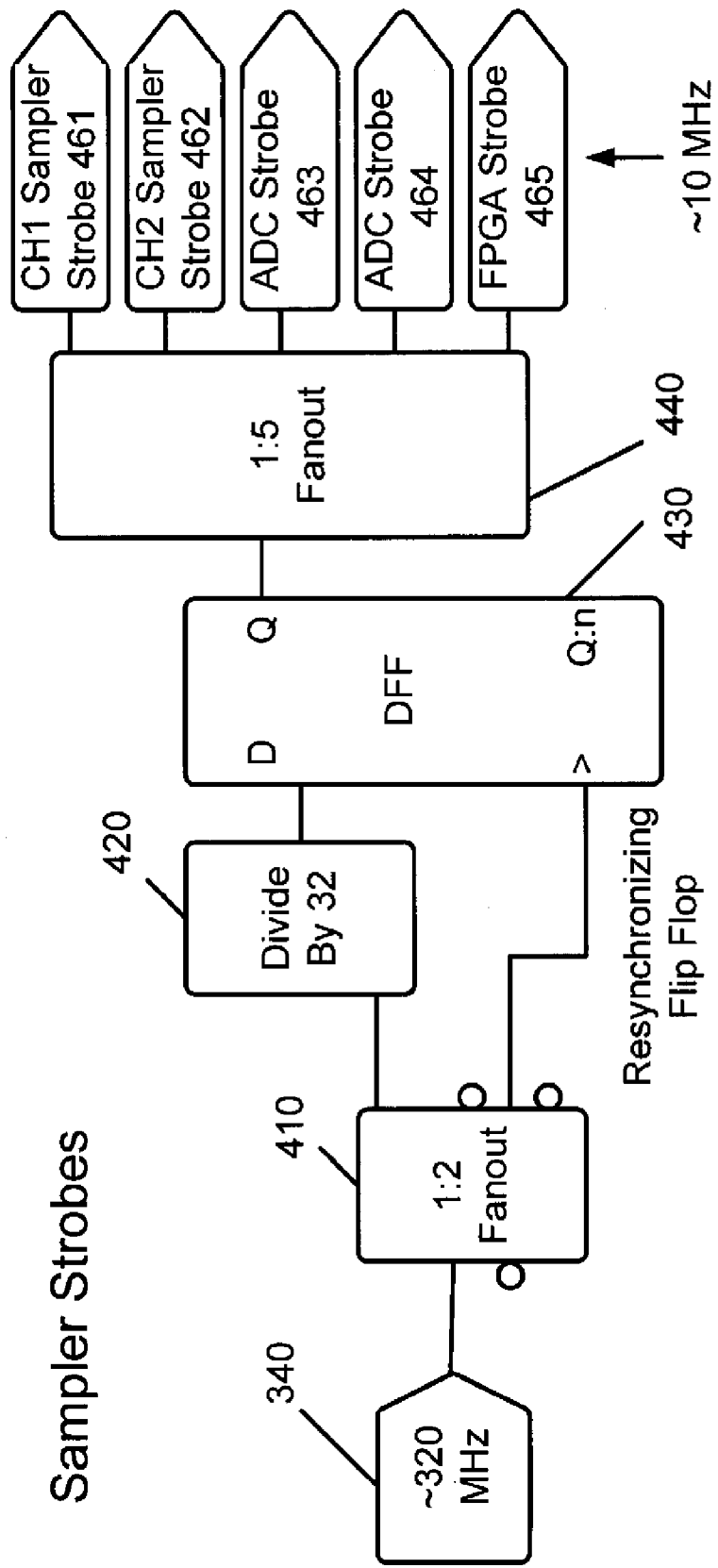
FIG. 4 is a schematic diagram depicting a further portion of the CIS timebase of FIG. 1 comprising a sampler strobe generator.

The ~320 MHz clock 340 may also be used in the sample clock generator shown in FIG. 4, and also comprises the CIS Timebase portion of FIG. 1. In particular, the ~320 MHz is first split at a 1:2 fanout 410, and then further divided by 32 at divider 420 to produce an approximately 10 MHz clock for the sampler strobe, ADC strobe and FPGA strobe. The ~10 MHz is resynchronized at Flip Flop 430 by the ~320 MHz clock from fanout 410 to reduce jitter. The resynchronized 10 MHz clock signal is then fanned out by 1:5 fanout 440, and is provided to the various strobes and samplers, CH1 Sampler Strobe 461, CH2 Sampler Strobe 462, ADC Strobe 463, ADC Strobe 464 and FPGA Strobe 465.

Figure 5:
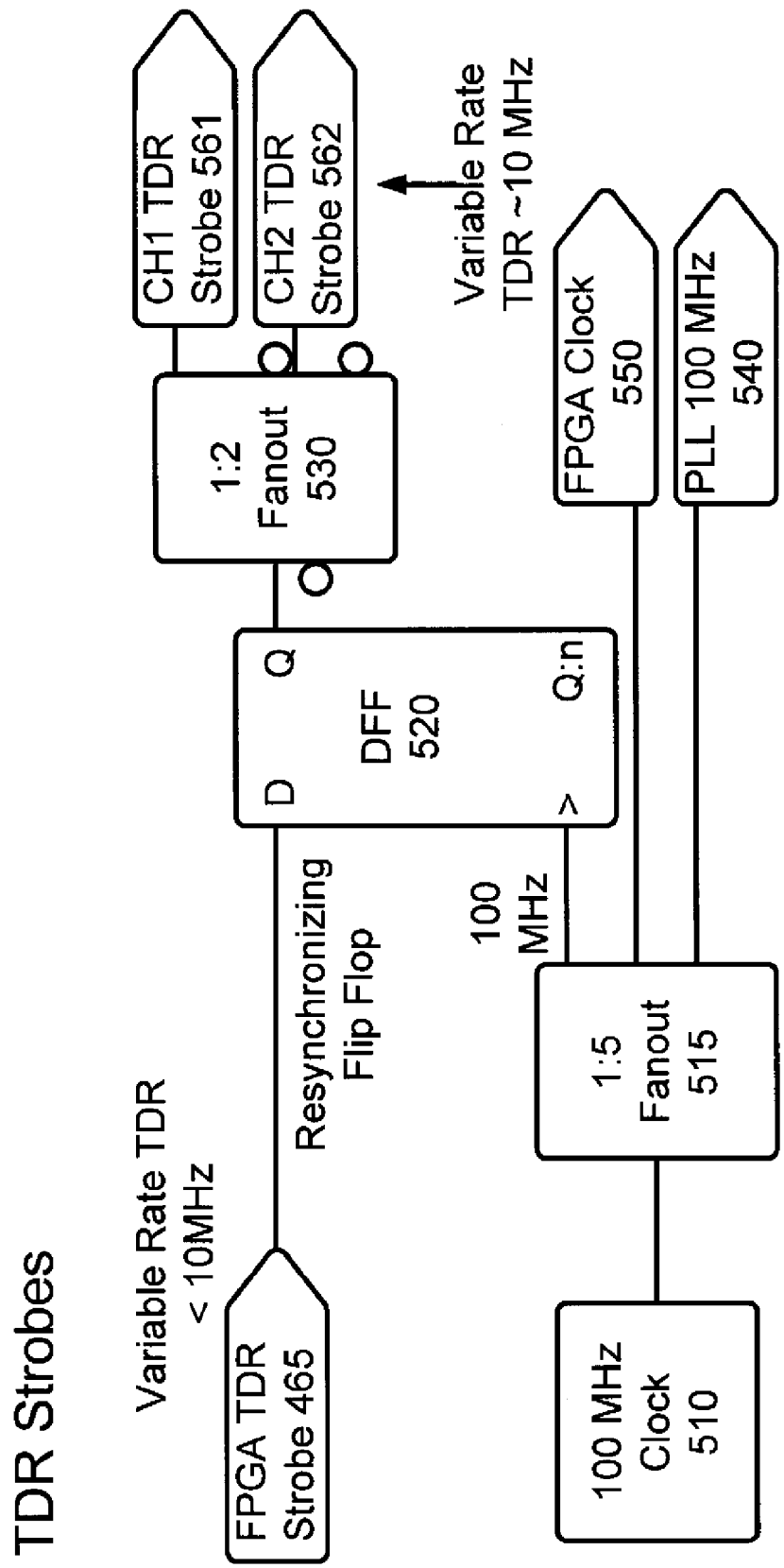
FIG. 5 is a schematic diagram depicting the TDR waveform generator of FIG. 1.

FIG. 5 depicts the TDR waveform generator shown in FIG. 1 in greater detail. A 100 MHz reference clock 510, after passing through a 1:5 fanout 515, is used to resynchronize the FPGA TDR strobe 465 through a resynchronizing Flip Flop 520 to produce the TDR output waveform, as described in FIG. 2, as received from the output of the sampler strobe section described in FIG. 4. A 1:2 fanout 530 provides this resynchronized signal to CH1 TDR Strobe 561 and CH2 TDR Strobe 562 at approximately 10 MHz. The 100 MHz clock (after passing through fanout 515) also provides a PLL 100 MHz reference clock 540 for the PLL and an FPGA clock 550 for the FPGA that generates the FPGA TDR strobe. The TDR strobe rate and duty cycle is determined by the FPGA TDR strobe 465 as described in FIG. 4.

In accordance with the various embodiments of the present invention, a linear and stable timebase allows one to measure the through response via time domain transmission (TDT) of a device under test (DUT) with high accuracy. A sampling module can be added to the system to measure the output of the DUT while a TDR strobe is provided as an input to the DUT. Suitable software can use the measured time domain TDR response and TDT response to calculate the scattering or S parameters of the DUT. Two TDR strobe generators with differential TDR strobes and sampling modules can be combined to measure the differential TDR and TDT response of the system. With suitable software the differential S parameters can be calculated.

In accordance with various embodiments of the present invention, one can rapidly acquire TDR response waveforms. Thus, averaging multiple responses, which may reduce the noise level of the response, can be performed without impacting acquisition time. Smaller discontinuities are easier to observe because of the averaging. When one observes a discontinuity one usually uses their finger to touch the circuit until one finds the physical location of the discontinuity. A finger usually causes a large depression in the TDR response that does not locate the discontinuity precisely. However, with averaging and a smaller dielectric probe such as a nylon pointing device or a piece of ceramic, one can precisely locate the discontinuity.

This invention has long time records at high time resolution. Small discontinuities at long times and therefore large physical distances from the initial step are easier to observe. Other TDR systems using sequential sampling to measure the response, usually window around the discontinuity to increase the time resolution. Those systems have limited memory and cannot observe the entire waveform at high time resolution. This invention has a large record length at high time resolution so windowing around the region of interest is not necessary. You can observe the initial step and the discontinuities at high resolution allowing you to see all the physical discontinuities of the circuit in one waveform. With the appropriate software, one could calculate S parameters over any portion of the large waveform without reacquiring the portion of interest.

While the invention has been described applicable to a TDNA apparatus, the invention is intended to be equally applicable to other test and measurement apparatuses and to electronic apparatuses in general.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

It is also to be understood that the following numbered paragraphs are intended to cover all of the generic and specific features of the invention herein described and all statements of the scope of the invention which, as a matter of language, might be said to fall there between.

What is claimed:

1. A method for performing a time domain reflectometry measurement, comprising the steps of:
    generating a plurality of sampling strobes in accordance with a coherent interleaved sampling timebase;
    generating a plurality of time domain reflectometry strobes;
    sampling a TDR waveform in accordance with the generated plurality of sampling strobes and plurality of time domain reflectometry strobes.

2. The method of claim 1, wherein the plurality of sampling strobes are generated in accordance with a 100 MHz reference clock.

3. The method of claim 1, wherein the plurality of time domain reflectometry strobes are generated in accordance with a 100 MHz reference clock.

4. The method of claim 1, wherein a number of samples taken of the time domain reflectometry waveform is a function of the sample time.

5. The method of claim 1, wherein the frequency of the sampling strobes and the time domain reflectometry strobes are slightly offset relative to each other.

6. The method of claim 5, wherein the sampling strobe sweeps over the time domain reflectometry waveform.

7. A system for performing a time domain reflectometry measurement, comprising:
    a coherent interleaved sampling timebase;
    a sampling strobe generator for generating one or more sampling strobes in accordance with the coherent interleaved sampling timebase;
    a time domain reflectometry sampling strobe generator for generating one or more time domain reflectometry strobes in accordance with one or more of the generated sampling strobes;
    a sampling module for sampling a time domain reflectometry signal in accordance with one or more of the one or more generated sampling strobes and one or more of the one or more generated time domain reflectometry strobes;
    an analog to digital converter for analog to digital converting the samples of the time domain reflectometry signal; and
    a memory for storing the converted samples of the time domain reflectometry signal.

8. The system of claim 7, wherein the plurality of sampling strobes are generated in accordance with a 100 MHz reference clock.

9. The system of claim 7, wherein the plurality of time domain reflectometry strobes are generated in accordance with a 100 MHz reference clock.

10. The system of claim 7, wherein a number of samples taken of the time domain reflectometry waveform is a function of the sample time.

11. The system of claim 7, wherein the frequency of the sampling strobes and the time domain reflectometry strobes are slightly offset relative to each other.

12. The system of claim 11, wherein the sampling strobe sweeps over the time domain reflectometry waveform.

* * * * *